(12) United States Patent
Mitchell et al.

(10) Patent No.: US 7,488,888 B2
(45) Date of Patent: Feb. 10, 2009

(54) ENERGY HARVESTING DEVICES

(75) Inventors: Bradley J. Mitchell, Snohomish, WA (US); Trevor M. Laib, Woodinville, WA (US); Kevin S. Callahan, Shoreline, WA (US)

(73) Assignee: The Boeing Company, Chicago, IL (US)

( * ) Notice: Subject to any disclaimer, the term of this patent is extended or adjusted under 35 U.S.C. 154(b) by 27 days.

(21) Appl. No.: 11/522,276

(22) Filed: Sep. 15, 2006

(65) Prior Publication Data

US 2008/0092937 A1   Apr. 24, 2008

(51) Int. Cl.
*H01L 35/00* (2006.01)
*H01L 37/00* (2006.01)

(52) U.S. Cl. .............. 136/200; 136/203; 136/205; 136/228; 136/230; 411/337

(58) Field of Classification Search ............. 136/200; 29/428, 825
See application file for complete search history.

(56) References Cited

U.S. PATENT DOCUMENTS

| | | | | |
|---|---|---|---|---|
| 3,737,959 A | * | 6/1973 | Smith et al. | 24/279 |
| 4,039,352 A | * | 8/1977 | Marinescu | 136/205 |
| 5,352,078 A | * | 10/1994 | Nasu | 411/337 |
| 6,118,204 A | * | 9/2000 | Brown | 310/303 |
| 6,150,601 A | * | 11/2000 | Schnatzmeyer et al. | 136/201 |

* cited by examiner

*Primary Examiner*—Kaj K Olsen
*Assistant Examiner*—Kourtney R Salzman
(74) *Attorney, Agent, or Firm*—Tung & Associates

(57) ABSTRACT

Energy harvesting devices are disclosed. An illustrative embodiment of the energy harvesting devices includes a fastening device, a first thermally-conductive element engaging the fastening device, a thermoelectric device disposed in thermal contact with the first thermally-conductive element and a second thermally-conductive element disposed in thermal contact with the thermoelectric device.

22 Claims, 2 Drawing Sheets

ENERGY HARVESTING DEVICES

FIELD OF THE INVENTION

The present invention relates to energy harvesting devices. More particularly, the present invention relates to thermoelectric energy harvesting devices which generate electrical power from thermal gradients.

BACKGROUND OF THE INVENTION

Energy harvesting devices generate electrical power from energy sources that are often overlooked and untapped. Examples of energy sources and methods to convert electricity include photovoltaic devices which convert light energy into electricity, cantilevered piezoelectric beams which convert vibrational energy into electricity and thermoelectric devices which convert heat flow into electricity. These energy harvesting devices and methods are amenable to a variety of applications.

As low power electronics become increasingly prevalent, energy harvesting devices and methods provide a useful way to power electronic devices without the need for batteries or electrical power wiring. Electrical wiring is undesirable in many applications due to its cost to design and install, as well as its weight and difficulty to retrofit. Batteries are undesirable on airplanes due to the difficulty of replacement and because some batteries pose environmental or safety hazards. Additionally, batteries typically function poorly in low temperatures. In some cases, electronic devices that occasionally require medium quantities of electrical power may be powered using low-power energy harvesting devices. In these cases, electrical energy generated by energy harvesting devices is stored in a capacitor or rechargeable battery.

SUMMARY OF THE INVENTION

The present invention is generally directed to energy harvesting devices. An illustrative embodiment of the energy harvesting devices includes a fastening device, a first thermally-conductive element engaging the fastening device, a thermoelectric device disposed in thermal contact with the first thermally-conductive element and a second thermally-conductive element disposed in thermal contact with the thermoelectric device.

BRIEF DESCRIPTION OF THE DRAWINGS

The invention will now be described, by way of example, with reference to the accompanying drawings, in which.

DETAILED DESCRIPTION OF THE INVENTION

Figure 1:
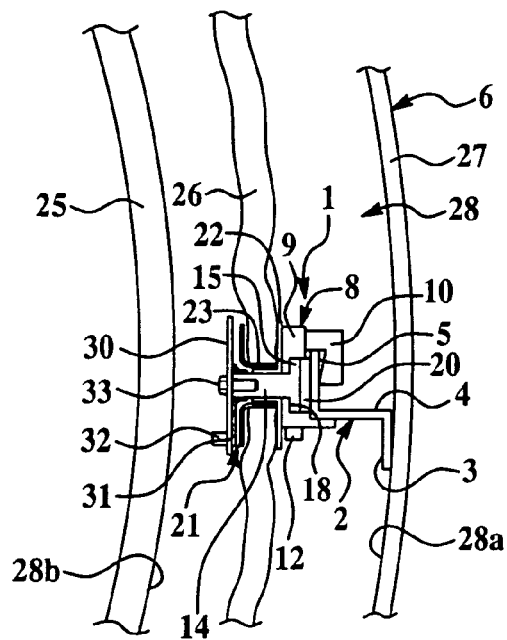
FIG. 1 is a cross-section of a wall portion of an aircraft, with an energy harvesting stringer clip attached to an insulation blanket in an illustrative application of the energy harvesting devices.

Referring initially to FIGS. 1-4, an illustrative energy harvesting stringer clip embodiment of the energy harvesting devices is generally indicated by reference numeral 1. The energy harvesting stringer clip 1 is adapted to generate electrical power from a thermal differential or gradient which exists inside an aircraft wall 6 of an aircraft typically during the cruising phase of aircraft flight. Generally, the aircraft wall 6 includes an interior panel 25, an outer aircraft skin 27 and a wall space 28 between the interior panel 25 and the aircraft skin 27.

The energy harvesting stringer clip 1 is adapted to both secure a thermal insulation blanket 26 in the wall space 28 and generate electrical power from a thermal differential or gradient which exists between opposite sides of the thermal insulation blanket 26, particularly during aircraft flight. While the energy harvesting stringer clip 1 having the particular structure shown in FIGS. 1 and 2 will be described with respect to the invention, it is to be understood that any type of stringer clip or attachment device which is capable of securing a thermal insulation blanket 28, electrical wiring (not shown), ECS ducting (not shown) or other device within a wall space 28 of an aircraft wall 6 may be adapted to generate electrical power across a thermal gradient according to the principles which will be described below with respect to the energy harvesting stringer clip 1.

Figure 2:
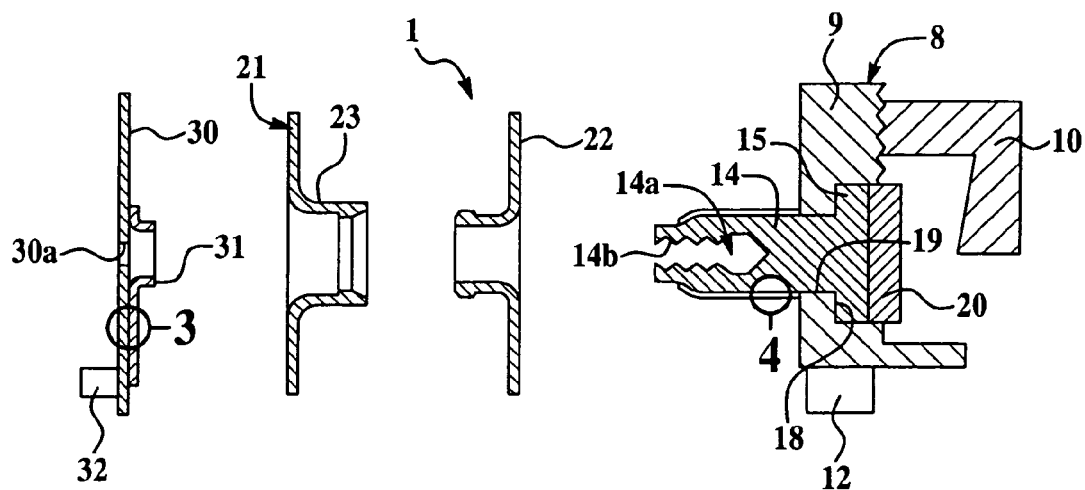
FIG. 2 is an exploded sectional view of the energy harvesting stringer clip shown in FIG. 1.

The energy harvesting stringer clip 1 includes a stringer 2 which is a thermally-conductive material such as metal, for example. The stringer 2 includes an attachment segment 3 which is attached to the interior surface of the aircraft skin 27, a spanning segment 4 which extends from the attachment segment 3 and a clip segment 5 which extends from the spanning segment 4. A stringer clip 8, which is a thermally-insulating material such as plastic, for example, is attached to the thermal insulation blanket 26 such as by using a blanket grommet 21, for example. The stringer clip 8 typically includes a clip body 9 and a resilient clip arm 10 which extends from the clip body 9. The blanket grommet 21 may include, for example, an inner grommet subunit 22 which is attached to the clip body 9 of the stringer clip 8 and snap fits into an outer grommet subunit 23, as shown in FIG. 2. As shown in FIG. 1, the inner grommet subunit 22 and the outer grommet subunit 23 extend through a grommet opening (not numbered) in the insulation blanket 26.

As shown in FIG. 2, a base cavity 18 is provided in the clip body 9 of the stringer clip 8. A post 14, which is a thermally-conductive material such as metal, includes a post base 15 which is situated in the base cavity 18. The post 14 extends from the post base 15, through a post opening 19 which extends through the clip body 9 and communicates with the base cavity 18. A thermoelectric device 20 is disposed in thermal contact with the post base 15 of the post 14, with the clip arm 10 of the stringer clip 8 disposed in spaced-apart relationship with respect to the thermoelectric device 20.

As further shown in FIG. 1, a heat exchange washer 30, which is a thermally-conductive material, is provided in thermal contact with the post 14. The heat exchange washer 30 may be attached to the post 14 using any suitable technique which is known to those skilled in the art. The heat exchange washer 30 may include cooling fins (not shown) to promote the exchange of heat with surrounding air. According to one suitable attachment technique, which is illustrated in FIG. 2, a fastener cavity 14a, having post threads 14b, extends into the post 14. A fastener opening 30a extends through the heat exchange washer 30. A spring collar 31, which is an electrically-conductive material, extends from the heat exchange washer 30 and surrounds the fastener opening 30a. A threaded washer fastener 33 (FIG. 1) extends through the fastener opening 30a of the heat exchange washer 30 and the blanket grommet 21, respectively, and is threaded into the fastener cavity 14a of the post 14. As shown in FIG. 1, the insulation blanket 26 is anchored to the aircraft skin 27 by inserting the clip segment 5 of the stringer 2 between the thermoelectric device 20 and the clip arm 10 of the stringer clip 8, with the clip segment 5 of the stringer 2 disposed in thermal contact with the thermoelectric device 20.

As shown in FIG. 1, the insulation blanket 26 divides the wall space 28 into an outboard area 28a which is adjacent to the aircraft skin 27 and an inboard area 28b which is adjacent to the interior panel 25 of the aircraft wall 6. The clip segment 5 of the stringer 2 and the post base 15 of the post 14 are disposed in thermal contact with opposite sides of the thermoelectric device 20. During aircraft flight, the stringer 2 is subjected to temperatures in the outboard area 28a, whereas the heat exchange washer 30 and post 14 are subjected to temperatures in the inboard area 28b. During the cruising phase of aircraft flight, temperatures in the outboard area 28a of the wall space 28 may reach temperatures as low as −30 degrees C., whereas temperatures in the inboard area 28b are approximately 16 degrees C. This translates into a temperature differential of about 45 degrees C. between the outboard area 28a and the inboard area 28b of the wall space 28. Temperature differentials may also exist during other phases of aircraft flight or ground operations or while the aircraft is parked. Therefore, a heat flow path is established from the heat exchange washer 30 and through the post 14, the post base 15 and the thermoelectric device 20, respectively, to the clip segment 5 of the stringer 2. In response to the flow of heat through the thermoelectric device 20, the thermoelectric device 20 generates electrical power through the Peltier-Seebeck effect.

Figure 3:
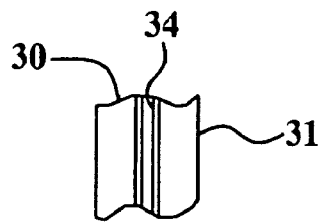
FIG. 3 is an enlarged sectional view, taken along section line 3 in FIG. 2.
Figure 4:
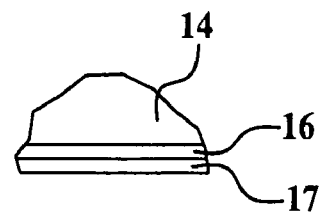
FIG. 4 is an enlarged sectional view, taken along section line 4 in FIG. 2.

FIGS. 2-4 illustrate the manner in which electrical power can be routed to electrical contacts on both sides of the insulation blanket 26 for convenience in utilizing electrical power from the energy harvesting stringer clip 1 from either side of the insulation blanket 26. As shown in the enlarged sectional view of FIG. 4, the post 14 can be coated first with an electrically non-conductive finish or dielectric sleeve 16 and then with an electrically-conductive finish such as a conductive sleeve 17. The post 14 is connected to one polarity of the thermoelectric device 20 (such as the positive pole, for example), while the conductive sleeve 17 is connected to the opposite polarity (negative pole) of the thermoelectric device 20. Therefore, the post 14 carries both polarities through the insulation blanket 26.

The heat exchange washer 30 is typically fastened to the post 14 using the electrically conductive washer fastener 33 (FIG. 1) Thus, the heat exchange washer 30 carries a positive charge, whereas the spring collar 31, which contacts the conductive sleeve 17 (FIG. 4) on the post 14, carries a negative, charge. As shown in the enlarged sectional view of FIG. 3, a dielectric coating 34 separates the positively charged heat exchange washer 30 from the negatively-charged spring collar 31. A non-conductive finish or paper (not shown) may be provided on the bottom side of the heat exchange washer 30 to prevent an electrical short between the heat exchange washer 30 and the spring collar 31.

To provide a convenient electrical interface, fastener holes (not shown) for wire lugs (not shown) can be incorporated into the heat exchange washer 30 and the spring collar 31. Alternatively, an electrical contact block 32 may be electrically connected to the heat exchange washer 30 and spring collar 31 in such a manner that electrical contacts within the contact block 32 can be used as a simple electrical interface. Similar electrical contact blocks 12 can be provided on the stringer clip 8 and/or other components in the outboard area 28a of the wall space 28 and connected to the heat exchange washer 30 and spring collar 31 to provide electrical power to the outboard area 28a of the insulation blanket 26. An energy storage device or sensor (not shown) may be connected to each or either contact block 12 and contact block 32 to receive and store the electrical power. The stored electrical power can be used to power various electrical devices (not shown) such as dimming windows or wireless structural health monitoring devices, for example. Alternatively, the contact block 12 and contact block 32 may be directly connected to the electrical devices for powering of the devices. In typical application, energy harvesting stringer clips 1 are provided in multiple locations on the insulation blanket 26 throughout the fuselage of the aircraft to ensure the adequate supply of electrical power to the electrical devices.

Figure 5:
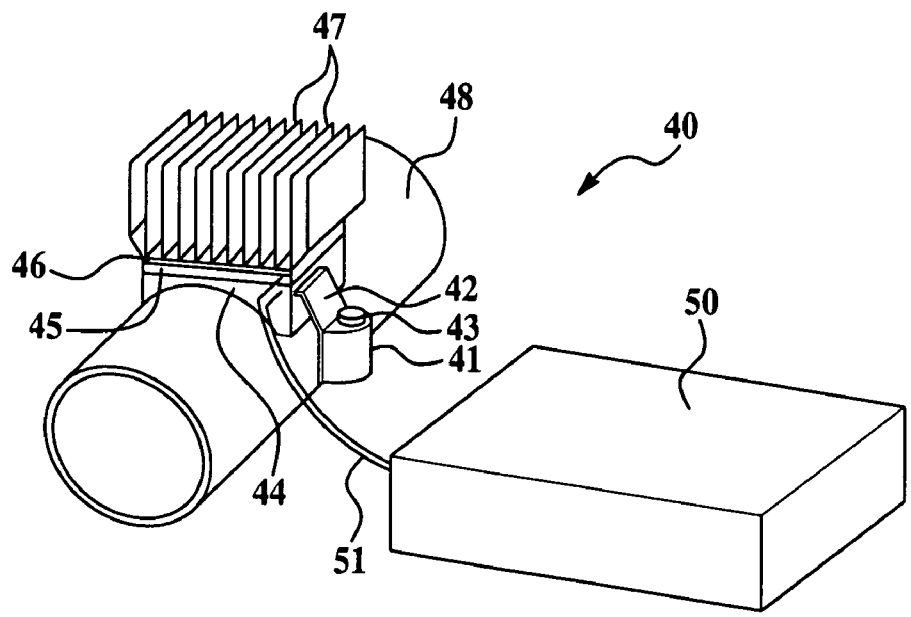
FIG. 5 is a perspective view of an energy harvesting clamp embodiment of the energy harvesting devices.

Referring next to FIG. 5, an illustrative energy harvesting clamp embodiment of the energy harvesting devices is generally indicated by reference numeral 40. The energy harvesting clamp 40 is adapted to generate electrical power from a temperature differential or gradient which exists between a conduit 48, such as a hydraulic tube or ECS duct, for example, and ambient air around the conduit 48. The energy harvesting clamp 40 is particularly suitable for wireless monitoring applications in the wing, tail or landing gear bay of an aircraft, where the addition or retrofit of wires would be difficult. For example, the energy harvesting clamp 40 is well-suited to flight test or health monitoring applications to report the position of an actuator or temperature of a surface without the need to extend a length of wiring to the monitored device.

The energy harvesting clamp 40 typically includes a clamp body 41. A clamp strip 42 is attached to the clamp body 41 by a clamp fastener 43. An adaptor block 44 is attached to the clamp strip 42. The adaptor block 44 is a thermally-conductive material such as metal, metal-impregnated plastic or thermally-conductive carbon, for example. The adaptor block 44 is configured to engage the conduit 48 as the clamp strip 42 secures the adaptor block 44 to the conduit 48. A first surface of a thermoelectric device 45 is provided in thermal contact with the adaptor block 44. A cooling fin base 46, from which extends multiple cooling fins 47, is provided in thermal contact with a second surface of the thermoelectric device 45. An energy storing device 50, such as a battery, for example, is electrically connected to the thermoelectric device 45, typically through wiring 51. Electrical devices (not shown), such as dimming windows or wireless structural health monitoring devices, for example, are connected to the energy storing device 50. Alternatively, the electrical devices may be connected directly to the thermoelectric device 45.

During flow through the conduit 48 of a fluid (not shown) having a temperature which is higher than the ambient air in contact with the cooling fins 47, a heat flow path is established from the walls of the conduit 48 and through the adaptor block 44, the thermoelectric device 45 and the cooling fin base 46, respectively. Heat is dissipated to the ambient air through the cooling fins 47. Thus, as heat flows through the thermoelectric device 45, the thermoelectric device 45 generates electrical power which is stored in the energy storage device 50 and then transmitted to the electrical devices (not shown), or alternatively, transmitted directly to the electrical devices.

During flow through the conduit 48 of a fluid (not shown) having a temperature which is lower than the ambient air in contact with the cooling fins 47, a heat flow path is established from the cooling fins 47 and through the cooling fin base 46, the thermoelectric device 45, the adaptor block 44 and the walls of the conduit 48, respectively. Heat is dissipated to the fluid flowing through the conduit 48. As the heat flows through the thermoelectric device 45, the thermoelectric device 45 generates electrical power which is stored in the energy storage device 50 and then transmitted to the electrical devices (not shown), or alternatively, transmitted directly to the electrical devices.

Although this invention has been described with respect to certain exemplary embodiments, it is to be understood that the specific embodiments are for purposes of illustration and not limitation, as other variations will occur to those of ordinary skill in the art.

What is claimed is:

1. An energy harvesting device, comprising:
   a fastening device;
   a thermoelectric device mounted to said fastening device, said thermoelectric device having a first side and a second side comprising major surfaces, said thermoelectric device adapted to produce electricity according to a Peltier-Seebeck effect when a temperature gradient is imposed across said thermoelectric device through said first and second sides;
   a first thermally-conductive element engaging said fastening device;
   said first side of said thermoelectric device disposed in thermal contact with said first thermally-conductive element; and
   a second thermally-conductive element disposed in thermal contact with said second side of said thermoelectric device;
   wherein said fastening device comprises a stringer clip having a clip body and a clip arm carried by said clip body, and wherein said first thermally-conductive element engages said clip body.

2. The energy harvesting device of claim 1 wherein said first thermally conductive element comprises a post having a post base disposed in thermal contact with said first side of said thermoelectric device.

3. The energy harvesting device of claim 2 further comprising a heat exchange washer disposed in thermal contact with said post.

4. The energy harvesting device of claim 1 wherein said second thermally-conductive element comprises a stringer.

5. The energy harvesting device of claim 4 wherein said stringer comprises an attachment segment, a spanning segment extending from said attachment segment and a clip segment extending from said spanning segment and disposed in thermal contact with said second side of said thermoelectric device.

6. An energy harvesting device, comprising:
   An energy harvesting device, comprising:
   a stringer clip having a clip body and a clip arm carried by said clip body;
   a base cavity provided in said clip body;
   a post having a post base seated in said base cavity;
   a thermoelectric device mounted in said clip body, said thermoelectric device having a first side and a second side comprising major surfaces, said thermoelectric device adapted to produce electricity according to a Peltier-Seebeck effect when a temperature gradient is imposed across said thermoelectric device through said first and second sides;
   said thermoelectric device having said first side disposed in thermal contact with said post base; and
   a stringer disposed in thermal contact with said second side of said thermoelectric device.

7. The energy harvesting device of claim 6 further comprising a heat exchange washer disposed in thermal contact with said post.

8. The energy harvesting device of claim 7 further comprising a spring collar carried by said heat exchange washer and a dielectric coating between said heat exchange washer and said spring collar and wherein said spring collar is connected to a second polarity of said thermoelectric device and said heat exchange washer is connected to a first polarity of said thermoelectric device.

9. The energy harvesting device of claim 8 further comprising a dielectric sleeve provided on said post and a conductive sleeve provided on said dielectric sleeve, said conductive sleeve connected to a second polarity of said thermoelectric device, said post connected to a first polarity of said thermoelectric device.

10. The energy harvesting device of claim 9 further comprising at least one contact block electrically connected to said spring collar and said conductive sleeve.

11. The energy harvesting device of claim 10 wherein said at least one contact block is carried by at least one of said heat exchange washer and said stringer clip.

12. The energy harvesting device of claim 7 further comprising a washer fastener attaching said heat exchange washer to said post.

13. The energy harvesting device of claim 6 wherein said stringer comprises an attachment segment, a spanning segment extending from said attachment segment and a clip segment extending from said spanning segment and disposed in thermal contact with said second side of said thermoelectric device.

14. The energy harvesting device of claim 6, where said post comprises an attachment end distal to said post base, said attachment end comprising a fastener cavity interior to said attachment end, said fastener cavity adapted to reversibly receive a fastener.

15. An energy harvesting device for use on an aircraft, comprising:
   a stringer clip having a clip body and a clip arm carried by said clip body;
   a base cavity provided in said clip body;
   a post having a post base seated in said base cavity;
   a heat exchange washer disposed in thermal contact with said post;
   a washer fastener attaching said heat exchange washer to said post;
   a thermoelectric device disposed in thermal contact with said post base;
   a spring collar carried by said heat exchange washer and connected to a first polarity of said thermoelectric device and a dielectric coating between said heat exchange washer and said spring collar;
   a dielectric sleeve provided on said post and a conductive sleeve provided on said dielectric sleeve and connected to a second polarity of said thermoelectric device;
   at least one contact block carried by at least one of said heat exchange washer and said stringer clip and electrically connected to said spring collar and said conductive sleeve; and
   a stringer having an attachment segment, a spanning segment extending from said attachment segment and a clip segment extending from said spanning segment and disposed in thermal contact with said thermoelectric device.

16. An energy harvesting device, comprising:

a fastening device;

a thermoelectric device mounted to said fastening device, said thermoelectric device having a first side and a second side comprising major surfaces, said thermoelectric device adapted to produce electricity according to a Peltier-Seebeck effect when a temperature gradient is imposed across said thermoelectric device through said first and second sides;

a first thermally-conductive element engaging said fastening device;

said first side of said thermoelectric device disposed in thermal contact with said first thermally-conductive element; and a second thermally-conductive element disposed in thermal contact with said second side of said thermoelectric device;

wherein said first thermally-conductive element comprises a post having a post base disposed in thermal contact with said first side of said thermoelectric device.

17. An energy harvesting device, comprising:

a fastening device;

a thermoelectric device mounted to said fastening device, said thermoelectric device having a first side and a second side comprising major surfaces, said thermoelectric device adapted to produce electricity according to a Peltier-Seebeck effect when a temperature gradient is imposed across said thermoelectric device through said first and second sides;

a first thermally-conductive element engaging said fastening device;

said first side of said thermoelectric device disposed in thermal contact with said first thermally-conductive element; and a second thermally-conductive element disposed in thermal contact with said second side of said thermoelectric device;

wherein said second thermally-conductive element comprises a stringer.

18. An energy harvesting device, comprising:

a fastening device;

a thermoelectric device mounted to said fastening device, said thermoelectric device having a first side and a second side comprising major surfaces, said thermoelectric device adapted to produce electricity according to a Peltier-Seebeck effect when a temperature gradient is imposed across said thermoelectric device through said first and second sides;

a first thermally-conductive element engaging said fastening device;

said first side of said thermoelectric device disposed in thermal contact with said first thermally-conductive element; and a second thermally-conductive element disposed in thermal contact with said second side of said thermoelectric device;

wherein said fastening device comprises a clamp, said clamp adapted to secure said first thermally conductive element in contact with a conduit, said first thermally-conductive element shaped to fit partially around an outer surface of a conduit.

19. The energy harvesting device of claim 18 wherein said clamp comprises a clamp body and a clamp strip extending from said clamp body, and wherein said first thermally-conductive element is engaged by said clamp strip.

20. The energy harvesting device of claim 18 wherein said second thermally-conductive element comprises a cooling fin base and a plurality of cooling fins extending from said cooling fin base.

21. The energy harvesting device of claim 18 wherein said first thermally-conductive element comprises an adapter block.

22. The energy harvesting device of claim 18 further comprising an energy storing device connected to said thermoelectric device.

* * * * *